United States Patent [19]

Harada et al.

[11] 3,890,636

[45] June 17, 1975

[54] MULTILAYER WIRING STRUCTURE OF INTEGRATED CIRCUIT AND METHOD OF PRODUCING THE SAME

[75] Inventors: Seiki Harada, Hachioji; Atsushi Saiki, Tokyo; Takahiro Okabe, Hachioji; Kikuji Sato, Kokubunji, all of Japan

[73] Assignee: Hitachi, Ltd., Japan

[22] Filed: Sept. 11, 1972

[21] Appl. No.: 287,637

[30] Foreign Application Priority Data

Sept. 9, 1971 Japan .............................. 46-69216

[52] U.S. Cl. ...................... 357/68; 357/69; 357/71

[51] Int. Cl. .............................................. H01l 5/00

[58] Field of Search .................................... 317/234

[56] References Cited

UNITED STATES PATENTS

| | | | |
|---|---|---|---|
| 3,501,681 | 3/1970 | Weir | 317/234 |
| 3,617,816 | 11/1971 | Riseman et al. | 317/234 |
| 3,620,932 | 11/1971 | Crishal et al. | 204/15 |
| 3,622,384 | 11/1971 | Davey et al. | 117/212 |

*Primary Examiner*—Michael J. Lynch
*Assistant Examiner*—E. Wojciechowicz
*Attorney, Agent, or Firm*—Craig & Antonelli

[57] ABSTRACT

An air-insulated multilayer wiring structure is characterized, in an integrated circuit having two or more wiring conductor layers, in that, on those parts of the surface of the first wiring conductor layer provided on a substrate which are necessary for connection of the second wiring conductor layer, there are disposed wiring conductor stanchions which are made of the same conductive material as that of the wiring conductor layer or a conductive material different therefrom and which are formed by a step of manufacture separate from the steps of forming the wiring conductor layers. A second wiring conductor layer is provided which is electrically and mechanically connected to the stanchions and which has substantially no level difference, and third, fourth and further wiring conductor layers are similarly provided, if necessary, and protective films are provided on conductor surfaces, as may be needed. An air layer between the adjacent wiring conductor layers is obtained by chemically or physically removing an insulating layer of, e.g., a resin as is formed at this part.

25 Claims, 23 Drawing Figures

MULTILAYER WIRING STRUCTURE OF INTEGRATED CIRCUIT AND METHOD OF PRODUCING THE SAME

BACKGROUND OF THE INVENTION

1. Field of the Invention:

This invention relates to a wiring structure of an integrated circuit and, more particularly, to a multilayer wiring structure having two or more wiring conductor layers and a method of producing it.

2. Description of the Prior Art:

In a prior-art method of producing a wiring conductor in an integrated circuit, particularly in a monolithic integrated circuit, a desired wiring pattern made of a conductor metal has been obtained in such way that, on a silicon substrate in which an active semiconductor element such as a transistor is formed in contact with the surface thereof, an insulating film of, for example, silicon dioxide is formed by a well-known process such as the vapor growth process and the high-frequency sputtering process, that those parts of the insulating film which are required for the connection between the substrate and the wiring conductor to be formed on the insulating film on the substrate are thereafter removed by a well-known photo-etching process, that the conductor metal such as aluminium is evaporated on the exposed parts of the substrate and the entire area of the insulating film, to form a metal film, and that unnecessary parts of the metal film are removed by the use of the photoetching process. In the case where it is intended to further construct one or more conductor layers above the wiring conductor layer, a desired wiring pattern has been obtained in such a manner that an insulating film is deposited thereon using the above method, that those parts of the insulating film which are necessary for the connection with the wiring conductor layer to be formed on said insulating film are thereafter removed by the photo-etching process that a conductor metal is subsequently evaporated on the entire area, and that unnecessary parts of the metal film are removed by the photo-etching process. Such a prior-art producing method has been disadvantageous in that, due to a level difference caused by the first wiring conductor layer or a level difference induced by apertures provided in the insulating film in the connecting portions between the conductor layers, the second wiring conductor layer is prone to be disconnected on a side of the stage or the part of the different level. Moreover, the insulating film at a part at which the first wiring conductor layer and the second wiring conductor layer intersect tends to give rise to pin holes, with the result that the two wiring conductors opposing each other with the insulating film held therebetween are liable to be shortcircuited.

As a process of manufacture which does not bring forth such level differences, a method has also been tried in which an aluminum film for a wiring conductor metal is evaporatively formed on the entire surface, whereupon the aluminum film at parts other than the required conductor is selectively converted into an aluminum oxide film by the anodic oxidation process. The method, however, has been disadvantageous in that, since the oxide aluminum film formed by the anodic oxidation process is generally porous and low in insulation, it lacks in reliability as regards the insulation between the conductor layers.

Besides, the insulator interposed between the wiring conductor layers is high in the dielectric constant, so that the capacity between the wiring conductor layers or the capacity between the wiring conductor layer and the substrate becomes large. For this reason, such prior-art structure has raised problems in case of manufacturing a device for high frequency.

In recent years, in order to eliminate the disadvantage due to the insulating film among those of the above prior-art methods, a multilayer wiring construction called "air isolation" has been developed. As an example thereof, a method has been known in which copper plating is carried out over the entire surface after formation of the first wiring conductor layer, apertures are formed at parts of the connection between the wiring conductor layers, the second wiring conductor layer is further formed selectively by the plating process, and only this copper layer is thereafter removed by etching.

With such a prior-art method of forming multiple wiring conductor layers owing to the air isolation, however, two layers are the limit. For three-layer or four-layer multilayer wiring structures, the method cannot be utilized or is very difficult to apply. More specifically, with the method in which copper is filled between the wiring conductor layers, coppering which precisely matches with a minute configuration of the wiring conductor layer is difficult and, besides, the occurrence of the level difference of the wiring conductor layer is not preventable. Accordingly, as the number of wiring conductor layers is increased, the difficulty becomes more serious. Since the air-insulated multilayer wiring structure thus formed is low in mechanical strength in the connecting portions between the first wiring conductor layer and the second one, the wiring conductor layers are bent by slight mechanical vibrations, and there is the danger that the first and second wiring conductor layers will be short-circuited. Moreover, as the number of wiring conductor layers becomes larger, the danger of a short-circuit between the respective wiring conductor layers is increased, and the disconnection of the connecting portions occurs more easily.

SUMMARY OF THE INVENTION

An object of the invention is to eliminate the above mentioned disadvantages of the multilayer wiring structure based on air isolation, namely, to provide a multilayer wiring structure of an integrated semiconductor circuit with the respective wiring conductor layers air-insulated, which structure causes no level difference in each wiring conductor layer and is highly reliable, and a method of producing such structure.

The air-insulated multilayer wiring structure according to the present invention is characterized in that, on those parts of the surface of the first wiring conductor layer provided on a substrate which are necessary for connection of the second wiring conductor layer, there are provided wiring conductor stanchions which are made of the same conductive material as that of the wiring conductor layer or a conductive material different therefrom, and that the second wiring conductor layer is provided which is electrically and mechanically connected to the upper end surfaces of the stanchions and which has substantially no level difference. Such multilayer wiring structure can be produced in a way that the entire area except the upper surfaces of the stanchions is covered with an insulating layer, particularly a resin layer, which is substantially even with the upper surfaces of the stanchions to which the second wiring conductor layer is connected, that the second wiring conductor layer of a predetermined pattern is thereafter formed on the upper surfaces of the stanchions and the resin layer, that, if necessary, these steps are further repeated to form the third and fourth wiring conductor layers, and that the resin layer is subsequently removed using chemical means and/or physical means.

The wiring conductor stanchion in the present invention has the functions of electrically connecting the first and second wiring conductor layers, and simultaneously supporting the second wiring conductor layer. With the prior-art multilayer wiring structure based on air isolation, since the connecting portions between the first and second wiring conductor layers are weak, the wiring conductor layer is sometimes bent on account of the weight of itself or the weight of the other wiring conductor layer formed thereon, and accordingly, there is the danger of the short-circuit between the wiring conductor layers. In contrast, with the structure according to the present invention, since the stanchions for supporting the second wiring conductor layer are provided anew, no trouble occurs due to bending of the wiring conductor layer.

In the present invention, the material of the stanchion may be the same as that of the wiring conductor layer, or a different metal material. As regards the method of providing the stanchions, in addition to the foregoing one, there is a method in which desired numbers of wiring conductor layers and insulating layers of, e.g., a resin are piled up, holes penetrating form the uppermost layer to the first wiring conductor layer are provided at positions at which the stanchions are to be formed, and conductors are formed in the holes by, e.g., non-electroytic plating to thereby provide the stanchions. In order to increase the current capacity of the wiring conductor and to improve the mechanical strength of the wiring conductor layer, it is also possible to increase the thickness of the wiring conductor layer to to the extent of the width of the conductor layer or more. Furthermore, protective films may be provided on the surfaces of the wiring conductor layers to the end of preventing the short-circuit between the wiring conductor layers, enhancing the mechanical strength, and preventing corrosion of the conductor layers due to a surrounding atmosphere. It has also been found that good results are obtained when a photo-resist material layer is used instead of the resin layer and when a treatment in a plasma discharge atmosphere or an ion beam irradiating treatment is employed for removal of the photo-resist material for obtaining the air isolation.

In this manner, the multilayer wiring structure according to the present invention causes no level difference in the wiring conductor layer, can be made a multilayer wiring construction of, needless to say, two layers and three or more layers, and has a sufficient mechanical strength, so that it is highly reliable. If necessary, it is also possible to increase the current capacity or to enhance the corrosion resistance of the conductor layer.

DETAILED DESCRIPTION OF THE INVENTION

The multilayer wiring structure and the method of producing the same according to this invention can be understood very well from the preferred embodiments described hereunder with reference to the foregoing figures.

EMBODIMENT 1

Figure 1A:
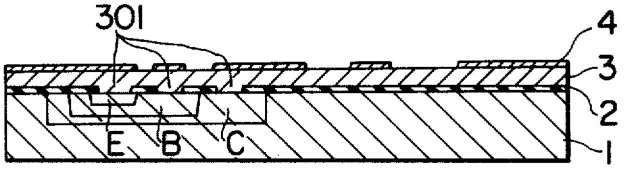
FIGS. 1*a* to 1*g* are schematic process diagrams showing in sectional views the steps of producing a multilayer wiring structure of the present invention.
Figure 1B:
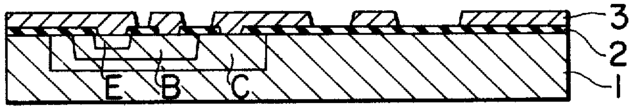
Figure 1C:
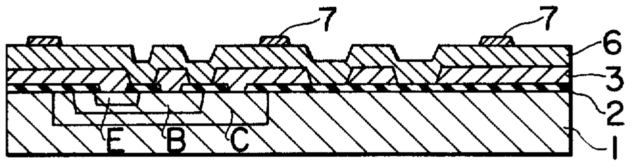
Figure 1D:
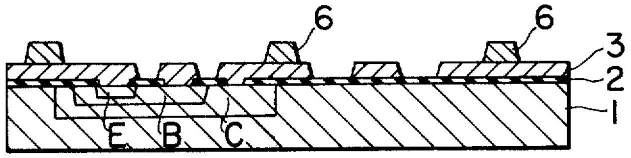
Figure 1E:
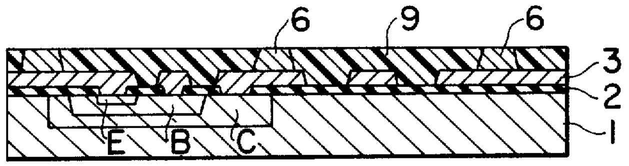
Figure 1F:
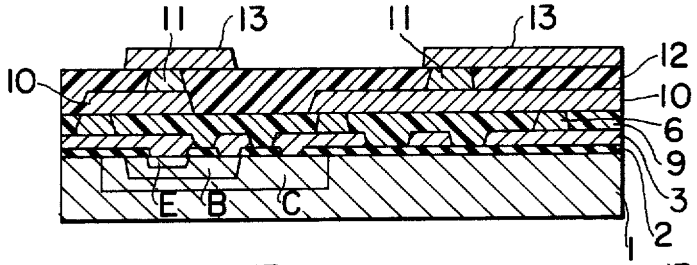
Figure 1G:
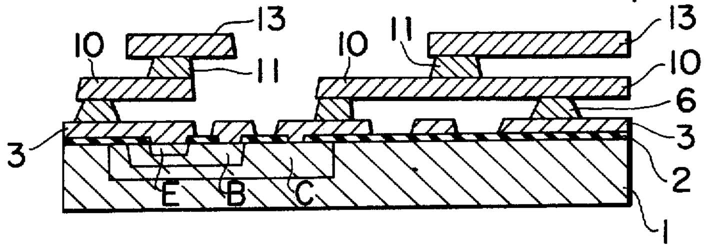

FIGS. 1*a* to 1*g* are schematic views showing the production steps of a three-layer wiring structure according to this invention, among which FIG. 1*g* is a sectional view illustrating the construction of the wiring structure obtained by the steps of manufacture.

First of all, as shown in FIG. 1*a*, a silicon dioxide film 2 deposited on a silicon substrate 1, in which a semiconductor element, for example, a transistor is formed as at a collector region C, a base region B and an emitter region E, is provided therein with openings 301 which lead to parts, such as the regions C, B and E, to be connected with the first wiring conductor layer on the silicon substrate. A film 3 of a conductor metal, e.g., aluminum is evaporated on the silicon dioxide film 2 and in the openings 301. On the aluminum film 3, a photo-resist film 4 conforming to the wiring pattern of the first wiring conductor layer is provided. Thereafter, those parts of the aluminum film 3 which are not covered by the photo-resist film 4 are removed by etching, to form the first wiring conductor layer 3 of aluminum as illustrated in FIG. 1*b*.

Subsequently, as shown in FIG. 1*c*, an aluminum film 6 is evaporated on the entire surface again. At parts at which the first wiring conductor layer and the second wiring conductor layer are to be connected, namely, at parts at which stanchions are to be formed, a photo-resist film 7 on the aluminum film 6 is left. Thus, etching of the aluminum film 6 is again conducted to remove the unnecessary parts thereof. Then, as illustrated in FIG. 1*d*, projections 6 (hereinafter termed "trapezoidal projections") each being made of the aluminum film and having a shape close to a trapezoid are formed on the first wiring conductor layer 3.

Thereafter, a highly polymerized resin or a prepolymer of highly polymerized resin which retains a suitable viscosity by a suitable solvent is coated on the substrate 1 on which the first wiring conductor layer is deposited. Usable as the resin is, for example, pyre-ML (trade name) made by Du Pont, a U.S. Corporation, which is a commercially-available polyimide series resin. As a solvent therefor, N-methyl-2-pyrrolidone is employable. In an example, the viscosity was about 100 C.P. to 300 C.P. The thickness of the coating is made to the extent that the trapezoidal projections 6 of aluminum are slightly covered. It is adjusted so that, when the thickness of the coated film is reduced from the original one due to vaporization of the solvent or the hardening reaction of the resin in the subsequent stage of solidifying the resin, the surface of the resin film 9 shown in FIG. 1*e* may become even with the trapezoidal projections 6. Next, the resin layer is solidified by heating thereof or vaporization of the solvent, and by way of example, the above-mentioned resin is heated at approximately 200°C for 20 to 40 minutes. In this way, the first wiring conductor layer and the first resin layer which have a sectional construction shown in FIG. 1*e* are formed.

When the resin film 9 is formed, very thin resin coatings sometimes remain on the upper surfaces of the trapezoidal projections 6. In this case, the upper surfaces of the trapezoidal projections 6 can be exposed in such way that the resin coatings are removed without losing the conductive property of aluminum by, for example, immersion in chemicals, such as undiluted sulfuric acid, pyrrolidone or dimethyl-sulfoxide, for a short time (e.g., for about 10 seconds to 3 minutes), treatment in the atmosphere of plasma discharge, or ion irradiating treatment.

The second wiring conductor layer is formed on the trapezoidal projections 6 and the first resin layer 9 as shown in FIG. 1*e*, by repeating the steps subsequent to the aluminum evaporation in FIG. 1*a*.

FIG. 1*f* is a sectional view showing a state in which the second wiring conductor layer 10 is provided by repeating the foregoing procedure trapezoidal projections 11 for connection to the third wiring conductor layer are provided, an insulating layer 12 made of a highly polymerized resin is thereafter provided, and the third wiring conductor layer 13 is formed on the insulating layer 12. It is, of course, possible to further form the fourth wiring conductor layer or more multilayered wiring conductor layers. In this case, the process may be repeated from the step illustrated in FIG. 1*c*.

In addition to the above-mentioned polyimide series resin, the highly polymerized resin for use in the present invention may be, for example, an epoxy series resin, a phenol series resin, a polycarbonate series resin, a polyamide imide series resin, a polybenzimidazole series resin, a polyamide series resin, a polystyrene series resin, or a combination of at least two of these resins. In other words, it may be any resin with properties capable of accomplishing the object of the present invention, that is to say, a resin which can be adjusted to an appropriate viscosity by a solvent, which is solidified and stabilized by vaporization of the solvent or heating at a temperature of or below about 300°C for about several tens minutes to several hours, and with which the solidifed resin film can be sufficiently removed by chemical or physical means. Since, however, it is usually necessary to heat the structure to or above about 150°C for the formation of the respective wiring conductor layers, it is desirable that the resin used is not remarkably softened at the temperature. Thermohardening resins are employable with less considerations from this viewpoint, but thermoplastic resins are also practicable under sufficient cares in many cases. Care must be taken to select a resin which is not remarkably softened by a temperature at the formation of a wiring layer, to select for the respective layers resins with which the lower resin layer is not remarkably softened at the solidifying temperature of the upper resin layer, to select resins with which the lower resin layer having already solidified is not eroded by the solvent of the upper resin layer, and to prevent a solvent, remaining in a solidifed resin layer, from being vaporized and thereby causing a trouble due to a vacuum atmosphere at the evaporative deposition.

Next, the resin layers 9 and 12 are removed from the wiring structure having the sectional construction as shown in FIG. 1*f*. Then, a three-layer wiring structure as shown in FIG. 1*g*, in which the respective wiring conductor layers are air-insulated from one another, is obtained. In this case, the removal of the resins can be very easily accomplished by the treatment in the plasma discharge atmosphere as is well known as a technique for removing a photo-resist layer. It can also be accomplished by the ion irradiating treatment which is similarly well known as a technique for removing a photo-resist layer. In an example, the etching amount of the resin film within an oxygen plasma discharge atmosphere under an $O_2$-gas pressure of about 1mmHg and with an output of about 2mW was about 0.5$\mu$/min. In addition, the removal of the resin can be often accomplished by immersing the structure into the solvent used. For example, when pyrrolidone or dimethylsulfoxide is used as the solvent and the structure is immersed in the solvent for about 10 to 20 minutes, the resin layer can be removed in many cases. In case the conductor wiring is complicated, the resin removing effect is more pronounced if the structure is immersed in the solvent with ultrasonic vibrations imparted thereto.

Figure 2:
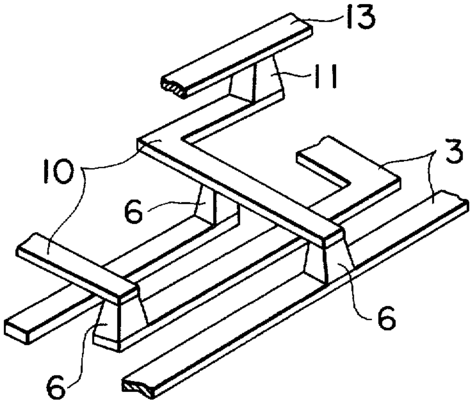
FIG. 2 is a perspective view showing the three-dimensional construction of only a wiring conductor portion located at the upper part of the multilayer wiring structure of the present invention.

FIG. 2 is a view in which only the wiring portions of the air-insulated multilayer wiring structure as shown in FIG. 1*g* are illustrated three-dimensionally.

The conductor stanchion for the inter-layer connection as illustrated by the trapezoidal projection 6 need not be always trapezoidal. Further, if the foregoing physical means is employed as the insulating layer removing means, photo-resist layers may be used in lieu of the resin layers. In this case, the respective photo-resist layers and the photo-resist films for formation of the conductor layer patterns must have different solvents.

EMBODIMENT 2

Figure 3A:
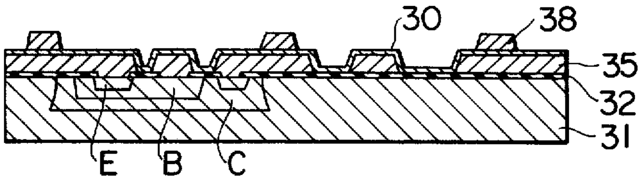
FIGS. 3*a* and 3*b* are schematic views showing some steps of manufacture in the case where each conductor wiring layer is made a double film in accordance with the present invention.
Figure 3B:
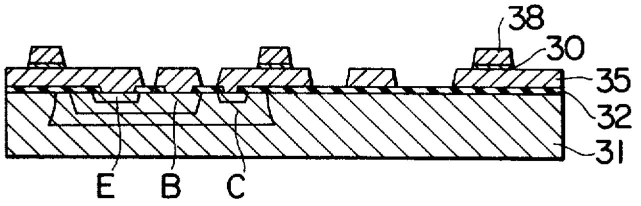

In embodiment 1, when the trapezoidal projections 6 are provided, the ground wiring conductor layer is sometimes etched slightly. In order to prevent the etching, the following process may be adopted. FIGS. 3*a* and 3*b* show some steps of the process.

First, a silicon dioxide film 32 perforated at predetermined positions is deposited on a silicon substrate 31 containing therein a transistor by the steps as in FIGS. 1*a* and 1*b*. The first wiring conductor layer 35 made of aluminum is formed on the silicon dioxide film 32. Thereafter, as shown in FIG. 3*a*, a very thin coating 30 of a metal not readily etched by an etchant of aluminum, such as gold, chromium, nickel, molybdenum and copper, is provided on the first wiring conductor layer 35 and the exposed parts of the silicon dioxide film 32 to a thickness of, for example approximately 200 to 500 A by the use of a well-known metal coating forming process such as evaporation. Subsequently, the entire surface evaporation of an aluminum layer for forming trapezoidal projections is carried out. Then, the trapezoidal projections 38 are formed by the photoetching process. In this case, the wiring conductor layer 35 being the lower layer is protected by means of the metal coating 30.

Subsequently, as illustrated in FIG. 3*b*, the metal coating 30 not covered by the trapezoidal projections 38 is removed by an etchant which does not etch aluminum but which etches the metal coating 30. Thus, the trapezoidal projections 38 can be provided with substantially no etching of the first wiring conductor layer 35 of aluminum. For example, in case of using gold for the metal coating 30, if a mixed liquid of phosphoric acid, nitric acid, glacial acetic acid and water, by way of example, is employed as the etchant of aluminum, gold is not eroded by the etchant. If, on the other hand, a mixed liquid of iodine, ammonium iodide and alcohol is used for removing the gold coating, the gold coating of about 500 A can be removed in about 10 to 20 seconds, and besides, aluminum is scarcely corroded during the removal of the gold coating.

After the above step, formation of a resin film as well as the second wiring conductor layer, formation of trapezoidal projections and formation of a resin film as well as the third wiring conductor layer are carried out whereupon the resin portions are removed. Then, a wiring structure having substantially the same shape as Embodiment 1 is obtained.

EMBODIMENT 3

While, in Embodiment 1, description has been made of an example in which aluminum is used as the metal material of the wiring conductor layers, it is also possible to employ one of the other metals such as gold, molybdenum, nickel, platinum and titanium, an alloy with at least two of the metals combined, or a conductor structure in the form of a multiple film in which the metals are laminated in two or more layers. These materials are excellent in mechanical strength as compared with aluminum. In particular, they are more stable than aluminum with respect to the chemical or physical exfoliation treatment when the unnecessary resin adhering to the topside of the trapezoidal projection (e.g., at 6 in FIGS. 1*a*–1*f* and at 38 in FIGS. 3*a* and 3*b*) provided for the connection of the lower wiring conductor layer with the upper one is removed to expose the topside. The manufacturing process in this case is similar to that of Embodiment 1.

EMBODIMENT 4

In FIG. 1*c* in the case of the embodiment 1, a metal different from that of the conductor layer 3 may also be employed for the conductor layer 6 which is to become the trapezoidal projections. More specifically, the conductor layer 3 is made a three-layer conductor structure of molybdenum-gold-molybdenum, while the conductor layer 6 is composed of aluminum. With such construction, since the three-layer conductor structure of molybdenum-gold-molybdenum is not eroded by the etchant of aluminum, there is the advantage that the wiring conductor layer is stable to the etching for providing the trapezoidal projections 6. The producing process in this case is also similar to that of Embodiment 1.

EMBODIMENT 5

This embodiment relates to a multilayer wiring structure in which, in the air-insulated multilayer wiring structures obtained in the Embodiments 1 to 4, protective films are provided on the surfaces of the air-insulated conductor layers and on the surfaces of the wiring conductor stanchions in order to prevent the short-circuit between the wiring conductor layers, to enhance the mechanical strength, to avoid corrosion of the conductor layers due to a surrounding atmosphere, and to raise the reliability of the wiring structure.

Figure 4:
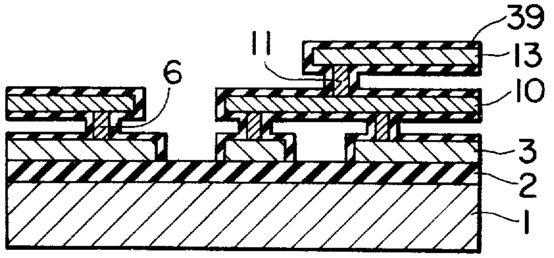
FIG. 4 is a sectional view of a multilayer wiring structure in which protective films are provided on conductor layers in accordance with the present invention.

According to this embodiment, the structure as shown in FIG. 1*g* is formed using aluminum (approximately 1 μm thick) as the conductor material. Thereafter, it is subjected to anodic oxidation to form a multilayer wiring structure in which the surfaces of the aluminum layers are protected by alumina films. When the formation treatment is carried out at an applied voltage of about 40V for about 10 minutes using an ammonium borate solution of about 5 percent for an anodic formation solution (Anode side: a specimen to be formed, and herein the structure shown in FIG. 1*g*. Cathode side: a platinum electrode.), the non-porous alumina films 39 being approximately 500 to 600 A are formed on the aluminum surfaces (FIG. 4). Reference numerals in FIG. 4 correspond to those in FIG. 1*g* except 39. Owing to the alumina films, the insulating property and the mechanical strength are increased as compared with those of the construction made only of aluminum, and therewith, the prevention of corrosion becomes very effective.

It is also possible to protect the aluminum with thicker and stronger alumina films by increasing the applied voltage at the formation (the grown film thickness being 14 A /V). It is also possible to further increase the mechanical strength by filling the resin between the wiring conductor layers again after the formation of the protective films 39.

EMBODIMENT 6

This embodiment is a wiring structure in which, in order to attain the same object as in Embodiment 5, the structure as shown in FIG. 1*g* is formed using an Au-Cr alloy as the conductor material, whereupon heat treatment is performed in an oxidizing atmosphere thereby to diffuse Cr into the surfaces of the conductor layers, and an oxide of Cr is formed at the surfaces so as to use the oxide films as protective films.

A conductor consisting of about 95 percent by weight of Au and about 5 percent by weight of Cr is formed by the vacuum evaporation process, to form the structure in FIG. 1*g*. Thereafter, it is heat-treated at about 450°C in the air for about 3 hours. Then, in case of a wiring layer thickness of, e.g., 1 μ, layers of Cr having a thickness of approximately 200 to 300 A are formed over the entire area of the surfaces. The Cr layers are turned into $Cr_2O_3$ films of a thickness of approximately 500 to 700 A through the reaction of Cr with oxygen in the air, and become good protective films.

In comparison with the structure in which the conductor material consists only of gold, the structure of this embodiment can be said to be very excellent from the viewpoints of the mechanical strength and the electrical insulation. The embodiment is schematically shown in FIG. 4.

EMBODIMENT 7

This embodiment relates to a wiring structure in which, in order to accomplish the same object as in Embodiment 5, the structure as shown in FIG. 1*g* is formed using various kinds of conductor materials such as aluminum, nickel, gold and copper, whereupon a highly polymerized resin is applied on the surfaces of the conductor layers so as to form protective films.

For example, when an epoxy resin (trade name: Epicoat 1007), a phenol resin (BKR 2620) and a solvent (diacetone alcohol) are mixed at proportions by weight of 3 : 7 : 50 to 3 :7 :100, a pre-polymer having a viscosity of 30 C.P. to 15 C.P., respectively, is produced. The pre-polymer is rotationally coated on the entire area of, e.g., the structure shown in FIG. 1*g* at a speed of about 1,000 to 3,000 r.p.m., and heat-treated at about 200°C for about 2 hours. Then, coatings of approximately 600 to 2,000 A can be formed on the surfaces of the conductor material.

The structure of the embodiment can be said to have extraordinarily excellent mechanical strength and insulating properties. It is schematically illustrated in FIG. 4.

EMBODIMENT 8

This embodiment relates to a wiring structure in which, in order to achieve the same object as in Embodiment 5, the multilayer wiring structure as shown in FIG. 1*g* is formed, whereupon glass films are formed on the surfaces of the conductor layers so as to use them as protective films.

Glass powder of a low fusing point (200° to 450° C) is caused to retain an appropriate viscosity by a suitable solvent, and is coated on the surfaces of the air-insulated wiring structure as in FIG. 1*g*. Used as the glass powder is, for example, one which is commercially available under the trade name of Corning 1826 (in which the principal constituents are $SiO_2$ and $B_2O_3$, and $Al_2O_3$ and PbO are also contained.) and which is made fine powder of a grain diameter of about 0.1 to 0.02$\mu$. The glass powder is mixed into an amyl acetate solution of nitrocellulose into a pasty state having an appropriate viscosity. When the paste of a viscosity of 30 to 100 C.P. is rotationally coated on the entire area of the structure at about 3,500 to 7,000 r.p.m., coatings of a thickness of about 0.5 to 3$\mu$ are formed. In order to further lower the viscosity, methanol may be mixed into the glass powder paste.

After coating the glass paste as described above, the structure is heated at about 200° to 300°C in a nitrogen gas furnace for about 5 to 10 minutes to perfectly vaporize the organic solvent in order to prevent blackening and foaming due to the solvent. Thereafter, the structure is further heated at about 400° to 500°C for about 15 to 20 minutes, to fuse the glass powder so as to form glass films on the surfaces of the wiring structure. Then, it is cooled to the room temperature at a cooling rate of about 10° to 25°C/min.

The wiring structure, thus formed with the glass films on the surfaces, is schematically depicted in FIG. 4. In order to make the thickness of the glass films a desired one, the viscosity of the glass paste and the number of revolutions in the rotational coating may be regulated.

The glass is not restricted to the above-mentioned Corning 1826, but it may be other glasses made by Corning Inc., such as 7050, 7052 (whose principal components are $SiO_2$ and $B_2O_3$), 7579 and 7720, or any other glass having properties capable of accomplishing the object of the present invention. The properties are that the glass can be adjusted to a suitable viscosity by a solvent at the normal temperature, that a treating temperature required for vitrification is one (usually, below approximately 800°C) which exerts no influence on diffused junction layers of a semiconductor element, that a glass film formed adheres closely to a metal material, and that the glass is physically and chemically stable such that the migration of ions contained is only slight.

EMBODIMENT 9

This embodiment relates to a structure in which, over the entire area of the structures described in Embodiments 5 to 8, the second protective film of e.g., silicon dioxide ($SiO_2$) is further deposited by the vapor growth process or the like.

Figure 5:
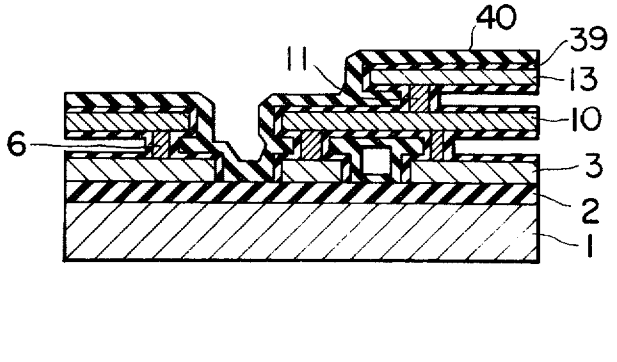
FIG. 5 is a sectional view of a multilayer wiring structure in which protective films are provided on conductor layers, and an $SiO_2$ film is further deposited on the entire surface.

When $SiO_2$ is deposited on the whole area of the structure shown in FIG. 4 at a temperature of about 300° to 400°C by the vapor growth process, an $SiO_2$ film 40 is deposited on the upper surfaces of the wiring layers as illustrated in FIG. 5. The structure envelops the upper faces of the wiring conductor layers in $SiO_2$, so that the strength against external vibrations is increased more. In addition, the structure is very effective from the viewpoint of protection of the surfaces against scratches.

The protective films of the conductor layers require such extent of heat resisting property that no trouble occurs in the course of the vapor growth of $SiO_2$. Reference numerals in FIG. 5 are the same as in FIG. 4 except 40.

EMBODIMENT 10

Embodiment alters the order of the steps of manufacture in Embodiment 1. In the embodiment 1, the stanchions for the inter-layer connection are formed after the formation of the first wiring conductor layer. In contrast, according to this embodiment, the stanchions for the inter-layer connection are first formed, whereupon the first wiring conductor layer is formed.

FIGS. 6*a* to 6*g* are schematic sectional views showing the manufacturing steps of a three-layer wiring structure in this embodiment.

Figure 6A:
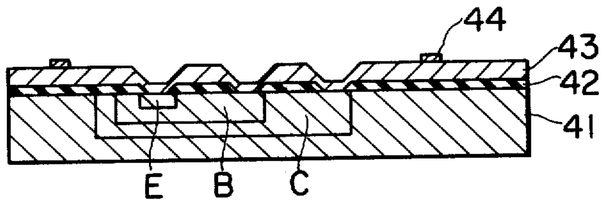
FIGS. 6*a* to 6*g* are schematic process diagrams showing, in sectional views, the steps of producing a multilayer wiring structure in which, in accordance with the present invention, stanchions between wiring conductor layers are first formed, whereupon a desired wiring pattern is formed.

As illustrated in FIG. 6*a*, a silicon dioxide film 42 covering the entire area other than electrode lead-out parts is formed on a silicon substrate 41 in which a transistor element consisting of a collector region C, a base region B and an emitter region E and such elements as a diode and a resistor are made. Thereafter, an aluminum layer 43 is formed on the whole surface to the amount of a predetermined thickness (approximately 1 to 5$\mu$) by, e.g., the vacuum evaporation process. At parts at which conductor stanchions for the inter-layer connection are to be formed, a photoresist film 44 is selectively left on the aluminum layer 43.

Figure 6B:
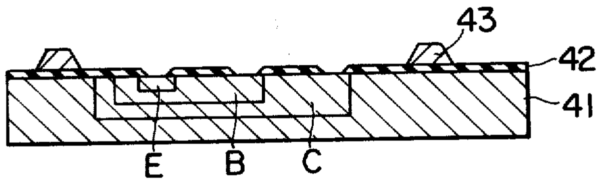
Figure 6C:
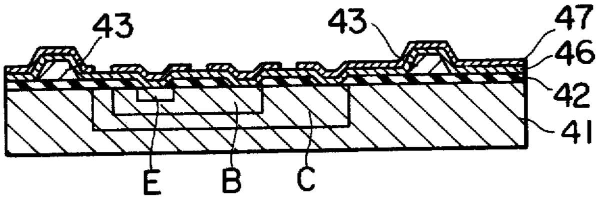
Figure 6D:
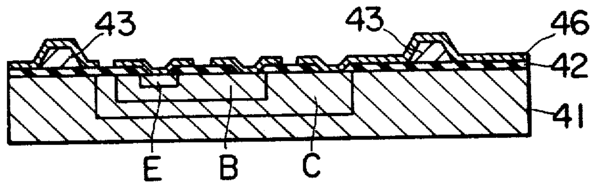

Subsequently, as shown in FIG. 6*b*, the aluminum layer at parts at which the photoresist film 44 is not present is removed by an etchant of aluminum, to form the connecting conductor stanchions 43, whereupon the photoresist film 44 on the stanchions 43 is removed. Thereafter, an aluminum layer 46 is deposited on the surface of the substrate by a predetermined thickness (approximately 0.5 to 1$\mu$) by, e.g., the vacuum evaporation process. As depicted in FIG. 6*c*, a photo-resist film 47 conforming to a predetermined pattern of the first wiring conductor layer is selectively left on the layer 46. Those parts of the aluminum layer 46 which are not covered with the photoresist film 47 are removed by the etchant of aluminum, whereupon the photoresist film 47 is also removed. Thus, the first wiring conductor layer 46 is formed as illustrated in FIG. 6*d*.

Figure 6E:
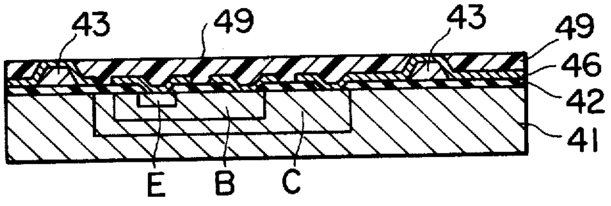

Thereafter, in accordance with the procedure described in Embodiment 1, a resin layer 49 is formed as shown in FIG. 6*e*.

In case the second wiring conductor layer is formed thereon, the aluminum evaporation in FIG. 6*a* and the subsequent steps may be repeatedly carried out again.

Figure 6F:
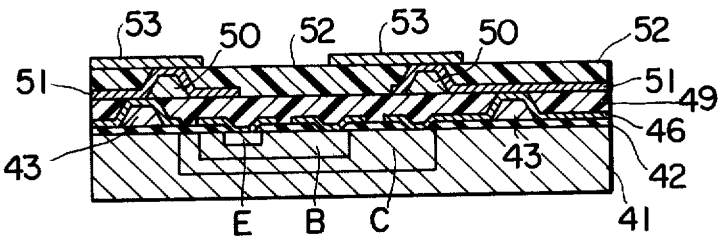

FIG. 6*f* is a section of a structure in which the foregoing procedure is repeated to provide conductor stanchions for the inter-layer connection 50 and the second wiring conductor layer 51, a resin layer 52 is thereafter provided, and the third wiring conductor layer 53 is formed on the resin layer 52.

Figure 6G:
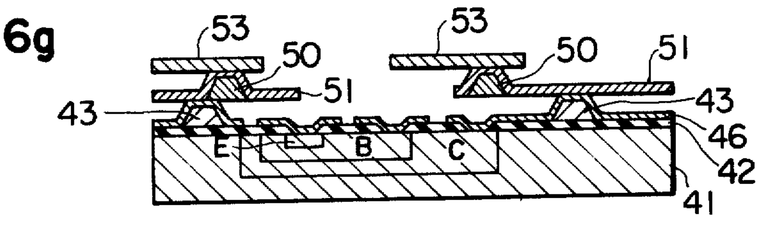

Further, FIG. 6*g* shows a section of a structure in which the resin layers of the three-layer wiring structure in FIG. 6*f* are removed by the procedure described in Embodiment 1, to thereby air-insulate the layer.

The wiring conductor layer amd the conductor layer for the inter-layer connection in the present invention, especially the latter which is generally desired to be thicker than the former, may also be formed, not by the evaporation only, in such a way that a thin conductor layer is first evaporated, whereupon the same kind or a different kind of conductor layer is deposited thereon by electrodeposition, so as to form the conductor layer of a desired thickness. The conductor layers can also be formed by the use of a conductive paste.

EMBODIMENT 11

This embodiment relates to a multilayer wiring structure in which, in the air-insulated multilayer wiring structures obtained by embodiments 1 to 9, the thickness of each wiring conductor layer is made larger than the width of the same in order to raise the current capacity of the wiring conductor and to improve the mechanical strength of the wiring conductor layer.

On a silicon wafer which contains a transistor therein, silicon dioxide is deposited over the entire area to a thickness of about 5 to 10$\mu$ (herein, the wiring width and the electrode widths of the emitter, base and collector being made 2 to 5$\mu$.) by the well-known thermal oxidation process and chemical vapor growth process. Thereafter, only those parts of the silicon dioxide film which exist on electrode portions are removed by irradiation of, e.g., an electron beam or an ion beam, and electrode apertures are thus provided. Next, nickel is deposited on the entire area of the substrate and the silicon dioxide film to a thickness of about 500 to 1,000 A by vacuum evaporation. When the substrate thus treated is subjected to ultrasonic washing, the nickel film on the silicon dioxide film is removed, whereas the nickel on the silicon substrate is not. Therefore, the nickel film is left only in the desired electrode portions. On the substrate thus prepared, nickel is deposited by non-electrolytic plating until it becomes even with the surface of the silicon dioxide film.

Next, aluminum is evaporated on the whole surface of the substrate to a thickness of about 500 to 1,000 A. The aluminum film is photo-etched in conformity with a predetermined wiring pattern, to form the wiring pattern film.

Thereafter, a resin layer of about 5 to 10$\mu$ is deposited by the procedure as in Embodiment 1. Only those parts of the resin film which exist on the above wiring pattern of aluminum are removed. Subsequently, a zinc film is formed on the aluminum film to a thickness of about 500 A or so by non-electrolytic plating. Then, nickel is deposited by non-electrolytic plating until it becomes even with the resin film.

Next, aluminum is again evaporated on the entire area of the substrate to a thickness of about 500 to 1,000 A. Photoetching is conducted so that the aluminum layer may remain only at parts at which the first wiring conductor layer and the second wiring conductor layer are to be connected. Therafter, a resin layer of about 5 to 10$\mu$ and a nickel layer of the same height are formed by the procedures as in the foregoing, to thus form stanchions for the inter-layer connection.

Next, the second wiring conductor layer is formed by the similar procedure.

Three or more wiring conductor layers can be formed by repeating the steps of manufacture stated above.

If the resin between the wiring conductor layers of the multilayer wiring structure formed in this way is removed by the procedure described in Embodiment 1, there is obtained an air-insulated multilayer wiring structure having thick wiring conductor layers.

EMBODIMENT 12

This embodiment relates to a multilayer wiring structure in which desired numbers of wiring conductor layers and insulator layers are stacked, holes penetrating form the uppermost layer to the first wiring conductor layer are provided at positions at which stanchions are to be disposed, and a conductor is filled into the holes to thereby form the stanchions for the interlayer connection. In accordance with this embodiment, the number of manufacturing steps can be cut down by reducing the number of photo-etching steps for the connection between the wiring layers to one.

Figure 7A:
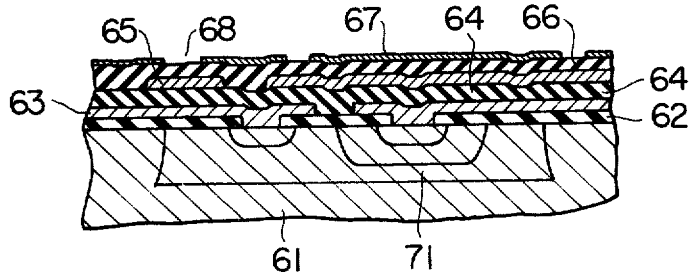
FIGS. 7*a* to 7*d* are schematic process diagrams showing in sectional views the steps of manufacture in the case where, in accordance with the present invention, holes penetrating through the respective layers are provided, and stanchions are formed in the holes.
Figure 7B:
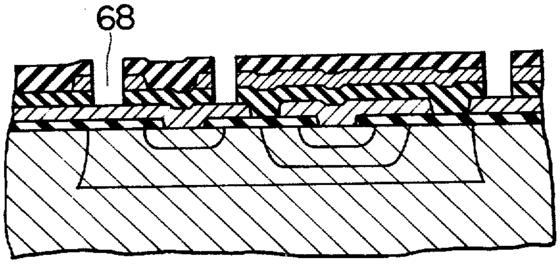
Figure 7C:
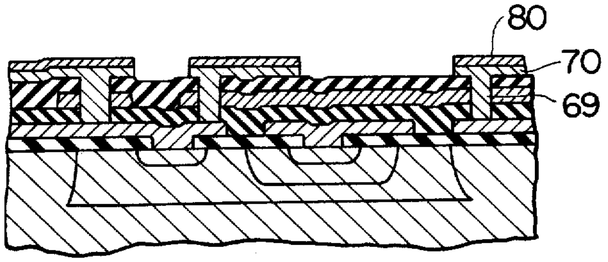
Figure 7D:
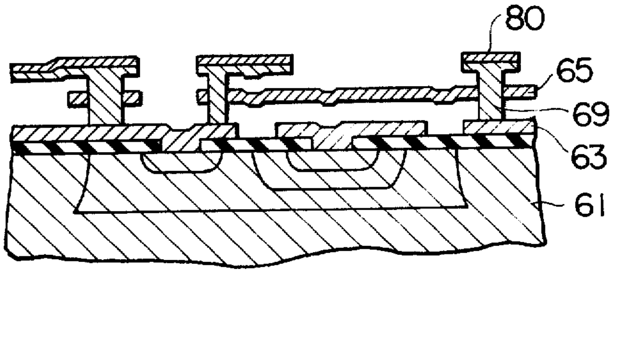

First, as illustrated in FIG. 7*a*, an element 71 (an NPN-type transistor in the embodiment) is made in a P-type semiconductor substrate 61 by a well-known process of producing an integrated semiconductor circuit. The first insulating layer ($SiO_2$) 62 formed on the surface of the substrate 61 is selectively perforated by the photo-etching process. The first wiring conductor layer 63 connected with the openings is formed. The wiring conductor layer is made, for example, a multiple film in which an aluminum film is deposited by approximately 0.5 to 1$\mu$m by a well-known evaporation process, and a nickel film is evaporated thereon by about 0.5 to 1$\mu$m. It has the wiring formed by the photo-etching process. Subsequently, the second insulating layer 64 is stuck to the entire surface of the substrate thus treated. Used for the second insulating layer is a photo-resist material well known in the photo-etching process under such designations as KPR and KTFR, which is coated thickly, for example, by approximately 1 to 2$\mu$m and which is exposed to light over the entire area of the coating. Next, the second conductor layer being, for example, a triple film 65 wherein nickel is deposited on aluminum and aluminum is again deposited on the nickel is evaporated on the insulating layer 64 as in the foregoing, and the second wiring conductor layer is formed by photo-etching. On the finished second wiring conductor layer, the third insulating layer being, for example, a thermohardening resin film 66 in which epoxy and phenol are dissolved in diacetone alcohol is again coated over the entire area by about 2 to 3$\mu$m. The resin film is baked to be hardened. Subsequently, the third conductor, e.g., chromium 67 is evaporated thereon by about 1 to 2$\mu$m. Using a through-hole mask for finally forming stanchions, the layer 67 of chromium being the third conductor is selectively perforated as at 68 by photo-etching. Using the perforated chromium layer as a mask, the exposed parts of the third insulating layer or the resin film 66 are taken away. In case of the above-mentioned composition, the resin film can be simply removed by, e.g., a well-known equipment called "oxygen plasma asher" in several minutes. Since the energy of the plasma incineration of the resin film is small, the other layers 67 and 65 of the conductor metals are not ruined at all. At the next step, the exposed parts of the second conductor layer are etched using a well-known etchant of nickel and aluminum, for example, dilute sulfuric acid for nickel and a phosphoric acid - nitric acid solution for aluminum. Phenol series resins are insoluble to almost all the acid and alkali solutions, and function for a mask. Since, however, chromium of the third layer is soluble to acid, it is removed. When the second conductor layer 65 is etched and the second insulating layer 64 is exposed, the insulator layer 64 is removed as the next step. In this case, the insulator is the photo-resist material, such as KPR and KTFR, having sensed light. It can therefore be easily removed by a well-known photo-resist removing agent such as J-100. Of course, the agent J-100 does not attack the other metals and insulating layers. Thus, as illustrated in FIG. 7*b*, the through-holes 68 penetrate from the uppermost layer to the first layer. Next, as shown in FIG. 7*c*, the holes are filled with a conductor 69 to perform the inter-layer connection. Plating is carried out as at 69 in FIG. 7*c* by, e.g., nonelectrolytic nickeling. The nickel plating is conducted, by way of example, such that, as is well known, there is used a solution which contains as its principal constituents about 20 – 40 g/l of nickel chloride and about 10 – 30 g/l of hypophosphorous soda, in which about 40 – 60 g/l of ammonium citrate, about 30 – 60 g/l of ammonium chloride and ammonium hydroxide are adjusted to approximately pH 8 to 10 and which is made at about 90°C, and that the wafer processed as described above is bathed in the solution, to precipitate nickel at the parts of the through-holes 68. Since the upper part of the first wiring conductor layer 63 has the nickel layer formed by evaporation as previously stated, the plating of nickel is grown with the nucleus of the precipitation at the evaporated nickel layer. In addition, since the nickel layer held between the aluminum layers is exposed in the second wiring conductor layer 65, it is connected with the nickel plating layer grown at the exposed parts. Thus, the nickel plating is grown from the upper part of the first wiring conductor layer to the uppermost layer as at 69 in FIG. 7*c*, to form communicating conductors for the inter-layer connection. Later, they become stanchions for supporting the wirings. At the plating step, nickel is not grown onto the insulating layer 66. For this reason, the plating is stopped when the growth of nickel at the through-hole parts reaches the height of the third insulating layer. Then, nickel, for example, is evaporated as shown at 70. In order to lower the resistivity of the wirings, it is also allowed that aluminum 80 or the like is evaporated at the uppermost layer and that the third wiring conductor layer is formed as in FIG. 7*c* by photo-etching. The phenol series resin of the third insulating layer is exposed by the formation of the third wiring conductor layer, so that the resin is fully removed as shown in FIG. 7*d* by, e.g., the foregoing oxygen plasma asher at the next step. Then, the second insulating layer of KPR or KTFR is exposed beneath in addition to the second wiring conductor layer. As is well known, however, the photo-resist material can be similarly removed by the plasma asher. Therefore, the second insulating layer can also be fully eliminated within the identical asher. Since, in contrast, the $SiO_2$ layer is not attacked, the first insulating layer is left as it is.

Thus, the conductors 69 formed in the through-holes by the plating remain as the stanchions of the wirings of the respective layers. It is also possible to further provide protective films on the exposed surface portions of the metal conductors of the respective layers by, e.g., a well-known anodic oxidation process as may be needed. In this respect, description has been made in detail in Embodiments 5 to 9.

Although the anodic oxidation is difficult to be executed for nickel, it can be easily carried out for aluminum. In case of the three-layer wiring in FIG. 7*d*, the second wiring conductor layer being the intermediate layer is of the structure made of aluminum at the upper and lower parts and nickel at the middle part, so that the upper and lower aluminum surfaces of the wiring conductor layer can be covered with alumina films. The aluminum 80 of the third wiring conductor layer can also have the surface portions covered. Accordingly, the coverings are effective enough to prevent the short-circuit between the wiring conductor layers.

At parts at which the connection with the other wiring conductor layer is not required, a visor can be provided only around the stanchion so as to prevent the connection with the other wiring conductor layer.

The wiring structures and the methods of producing them as have thus far been described in detail can be applied, not only to the foregoing monolithic semiconductor devices, but also to a hybrid semiconductor device, a semiconductor device including a MOS element, a semiconductor microcircuit device requiring wirings, a hybrid integrated circuit formed on an insulating substrate of, e.g., alumina, and so forth.

As apparent from the above detailed description, the multilayer wiring structures of the present invention cause no level difference in each wiring conductor layer, and can securely effect the air insulation. The present invention therefore provides the multilayer wiring structures of very high reliability and the methods of producing them. The reliability can be more enhanced by providing the protective films on the wiring conductor layers or increasing the thickness of the wiring conductor layers.

What is claimed is:

1. A multilayer wiring structure comprising:

a semiconductor substrate;

a first conductive layer formed with a first prescribed pattern over a major surface of said substrate, said layer including at least one vertically extending land portion;

a second conductive layer, formed with a second prescribed pattern in contact with only at least one selected vertically extending land portion at a position above said substrate; and air spaces disposed between said conductive layers above said substrate.

2. The multilayer wiring structure according to claim 1, wherein said substrate is a semiconductor plate formed with a plurality of circuit elements in the surface portion thereof, and said first conductive layer is at least partially connected electrically to said circuit elements.

3. The multilayer wiring structure according to claim 1, further comprising a third conductive layer, formed with a third prescribed pattern in contact only through vertical stanchion portions with at least one selected portion of said second conductive layer.

4. The multilayer wiring structure according to claim 1, further including a protective film disposed over each layer surface exposed in a direction substantially perpendicular to the major surface of said substrate.

5. The multilayer wiring structure according to claim 4, wherein the conductor material is a gold - chromium alloy, while said protective film is made of a chromium oxide.

6. The multilayer wiring structure according to claim 4, wherein said protective film is a member selected from the group consisting of an alumina film, a resin film and a glass film.

7. The multilayer wiring structure according to claim 6, wherein a silicon dioxide film is further provided on the entire surface of said wiring structure having said protective film.

8. An air-insulated multilayer wiring structure for an integrated circuit comprising:

a first wiring conductor layer having a predetermined pattern which is connected with predetermined regions on a substrate and which also extends on an insulating film provided on said substrate;

wiring conductor stanchions which are made of a conductor and which are formed at predetermined positions on said first wiring conductor layer;

a second wiring conductor layer of a predetermined pattern which is electrically and mechanically connected with only the upper surface of said each wiring conductor stanchion and which is parallel to said substrate and has substantially no level difference; and a protective film on the surface of said conductors.

9. The multilayer wiring structure according to claim 8, comprising at least one composite layer consisting of wiring conductor stanchions and a wiring conductor layer, said composite layer being similarly constructed to said wiring conductor stanchions and said second wiring conductor layer which are provided on said first wiring conductor layer and being provided on said second wiring conductor layer.

10. The multilayer wiring structure according to claim 8, wherein said protective film is a member selected from the group consisting of an alumina film, a resin and a glass film.

11. The multilayer wiring structure according to claim 8, wherein the conductor material is a gold - chromium alloy, while said protective film is made of a chromium oxide.

12. The multilayer wiring structure according to claim 8, wherein a silicon dioxide film is further provided on the entire surface of said wiring structure having said protective film.

13. The multilayer wiring structure according to claim 8, wherein the conductor material is composed of at least one element selected from the group consisting of Al, Au, Mo, Ni, Cu, Pt and Ti.

14. The multilayer wiring structure according to claim 8, wherein said first wiring conductor layer is composed of a three-layer structure of molybdenum-gold-molybdenum, and said wiring conductor stanchions are composed of aluminum.

15. The multilayer wiring structure according to claim 8, wherein the conductor material is aluminum, and said protective film is made of alumina.

16. The multilayer wiring structure according to claim 8, wherein the thickness of said wiring conductor layers is larger than their width.

17. A multilayer wiring structure comprising:

a semiconductor substrate;

a first layer of insulating material selectively formed on the surface of said substrate;

a first conductive layer selectively formed on said first layer of insulating material, at least one portion thereof being disposed in contact with a surface portion of said substrate which is not covered with said first layer of insulating material;

at least one first conductive stanchion selectively disposed on said first conductive layer and extending therefrom to a prescribed height above said first conductive layer;

a second conductive layer disposed in contact with only the upper surface of said at least one first conductive stanchion, a portion of said second conductive layer extending in a direction substantially parallel to the surface of said substrate; and an air space disposed between said first and second conductive layers.

18. A multilayer wiring structure according to claim 17, further comprising at least one second conductive stanchion selectively disposed on said second conductive layer and extending therefrom to a predetermined height above said second conductive layer;

a third conductive layer disposed in contact with only the upper surface of said at least one second conductive stanchion, said third conductive layer extending in a direction substantially parallel to said first conductive layer; and an air space disposed between said second and third conductive layers.

19. A multilayer wiring structure according to claim 17, wherein said first conductive stanchion includes a thin metal layer disposed directly on the surface of said first conductive layer.

20. A multilayer wiring structure according to claim 17, wherein the exposed surfaces of each of said conductive layers and said at least one stanchion is coated with a first protective insulative film.

21. A multilayer wiring structure according to claim 20, wherein said first protective insulative film is a glass film.

22. A multilayer wiring structure according to claim 20, further comprising a second protective insulative film formed on said first protective insulative film.

23. A multilayer wiring structure according to claim 17, further including a third conductive layer disposed in contact with only said at least one first conductive stanchions at a position between said first and second conductive layers, with an air space provided between said first and third and said second and third conductive layers.

24. A multilayer wiring structure comprising:

a semiconductor substrate;

a first layer of insulating material selectively formed on the surface of said substrate;

at least one first conductive stanchion selectively disposed on said first layer of insulating material and extending therefrom to a prescribed height above said first layer of insulating material;

a first conductive layer selectively formed on said first layer of insulating material and on said at least one first conductive stanchion, at least one portion of said first conductive layer being disposed in contact with a surface portion of said substrate which is not covered with said first layer of insulating material;

a second conductive layer disposed in contact with only the upper surface of said first conductive layer on said at least one first conductive stanchion, and extending in a direction substantially in parallel with the surface of said substrate; and an air space disposed between said first and second conductive layers.

25. A multilayer wiring structure according to claim 24 wherein a portion of said second conductive layer extends upwardly away from the surface of said substrate, and a third conductive layer is disposed in contact with only said upwardly extending portion of said second conductive layer, said third conductive layer extending in a direction substantially in parallel with the surface of said substrate, and an air space being provided between said second and third conductive layers.

* * * * *